US010176927B2

(12) United States Patent
Matsunaga

(10) Patent No.: US 10,176,927 B2
(45) Date of Patent: Jan. 8, 2019

(54) COMPOSITE ELECTRONIC COMPONENT

(71) Applicant: MURATA MANUFACTURING CO., LTD., Kyoto-fu (JP)

(72) Inventor: Minoru Matsunaga, Nagaokakayo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 302 days.

(21) Appl. No.: 15/134,850

(22) Filed: Apr. 21, 2016

(65) Prior Publication Data
US 2016/0344181 A1    Nov. 24, 2016

(30) Foreign Application Priority Data

May 21, 2015  (JP) .................. 2015-103266

(51) Int. Cl.
*H02H 9/04* (2006.01)
*H01F 27/28* (2006.01)
(Continued)

(52) U.S. Cl.
CPC .............. *H01G 4/40* (2013.01); *H01G 4/005* (2013.01); *H02H 9/046* (2013.01);
(Continued)

(58) Field of Classification Search
CPC ...... H01G 4/005; H01G 4/40; H01F 27/2804; H01F 27/29; H01F 2027/2809;
(Continued)

(56) References Cited

U.S. PATENT DOCUMENTS 5,051,712 A * 9/1991 Naito .................. H01F 17/0013
   333/184
5,592,134 A * 1/1997 Ogata .................. C04B 35/491
   333/185
(Continued)

FOREIGN PATENT DOCUMENTS

CN    101276660 A    10/2008
CN    103964824 A    8/2014
(Continued)

OTHER PUBLICATIONS

An Office Action; "Notice of Preliminary Rejection," issued by the Korean Patent Office dated Apr. 20, 2017, which corresponds to Korean Patent Application No. 10-2016-0058171 and is related to U.S. Patent Application No. 15/134,850; with English language translation.

*Primary Examiner* — Kevin J Comber
(74) *Attorney, Agent, or Firm* — Studebaker & Brackett PC

(57) ABSTRACT

A coil portion providing a common mode choke coil and a protection element portion providing ESD protection elements are disposed so as to be aligned in a lamination direction of a component body. The ESD protection elements are composed of a ground electrode and discharge electrodes each located so as to be spaced apart from the ground electrode at a predetermined interval. Capacitor electrodes are provided so as to be opposed to the discharge electrodes thereby to form capacitors, and the capacitors and coil conductors of the common mode choke coil form an LC filter. Accordingly, noise removal characteristics are caused to have higher attenuation and a wider band than with a mere inductor.

10 Claims, 10 Drawing Sheets

(51) Int. Cl.
*H01G 4/005* (2006.01)
*H01G 4/40* (2006.01)
*H03H 1/00* (2006.01)
*H03H 7/01* (2006.01)
*H01F 27/29* (2006.01)
*H03H 7/42* (2006.01)

(52) U.S. Cl.
CPC .......... *H01F 27/2804* (2013.01); *H01F 27/29* (2013.01); *H01F 2027/2809* (2013.01); *H03H 7/427* (2013.01); *H03H 2001/0085* (2013.01)

(58) Field of Classification Search
CPC ...... H02H 9/044; H02H 9/046; H03H 1/0007; H03H 7/0115; H03H 7/427; H03H 2001/0085
USPC .......................................................... 361/56
See application file for complete search history.

(56) References Cited

U.S. PATENT DOCUMENTS

| | | | |
|---|---|---|---|
| 2008/0254968 A1 | 10/2008 | Kakuda et al. | |
| 2011/0007438 A1* | 1/2011 | Ito | H01F 17/0006 361/56 |
| 2014/0220364 A1 | 8/2014 | Umemoto et al. | |
| 2014/0347773 A1 | 11/2014 | Park et al. | |

FOREIGN PATENT DOCUMENTS

| | | |
|---|---|---|
| JP | 2009-099930 A | 5/2009 |
| JP | 2011-181512 A | 9/2011 |
| JP | 2014-053765 A | 3/2014 |
| JP | 2014-230278 A | 12/2014 |
| KR | 10-0844151 B1 | 7/2008 |
| KR | 10-1445741 B1 | 10/2014 |

* cited by examiner

COMPOSITE ELECTRONIC COMPONENT

CROSS REFERENCE TO RELATED APPLICATIONS

This application claims benefit of priority to Japanese Patent Application 2015-103266 filed May 21, 2015, the entire content of which is incorporated herein by reference.

TECHNICAL FIELD

The present disclosure relates to a composite electronic component and particularly relates to a composite electronic component obtained by combining a common mode choke coil and an electro-static discharge protection element.

BACKGROUND

A composite electronic component of interest to the present disclosure is disclosed, for example, in Japanese Unexamined Patent Application Publication No. 2011-181512. The composite electronic component disclosed in Japanese Unexamined Patent Application Publication No. 2011-181512 includes a component body having a laminated structure composed of a plurality of laminated insulating layers, and a coil portion providing a common mode choke coil and a protection element portion providing an electro-static discharge (ESD) protection element are disposed so as to be aligned in the lamination direction of the component body. The ESD protection element has a structure in which a gap is formed between paired electrodes and static electricity is released via the gap to ground.

FIG. 10 shows a preferred equivalent circuit of the composite electronic component disclosed in Japanese Unexamined Patent Application Publication No. 2011-181512.

Referring to FIG. 10, the composite electronic component 1 includes: first and second coil conductors 3 and 4 that form a common mode choke coil 2 and are magnetically coupled to each other; and four ESD protection elements 5 to 8.

One end of the first coil conductor 3 is electrically connected to a first coil terminal 9, and one end of the second coil conductor 4 is electrically connected to a second coil terminal 10. The other end of the first coil conductor 3 is electrically connected to a third coil terminal 11, and the other end of the second coil conductor 4 is electrically connected to a fourth coil terminal 12.

One end of each of the first to fourth ESD protection elements 5 to 8 is electrically connected in common to a ground terminal 13 to which a ground potential is applied. The other ends of the respective first to fourth ESD protection elements 5 to 8 is electrically connected to the first to fourth coil terminals 9 to 12, respectively.

Such a composite electronic component 1 is mounted on a pair of signal lines such that, for example, signals are inputted to the first and second coil terminals 9 and 10, and signals are outputted from the third and fourth coil terminals 11 and 12. The ESD protection elements 5 to 8 are able to absorb an overvoltage caused by electro-static discharge, and thus the composite electronic component 1 functions as a common mode filter having an ESD protection function.

In recent years, achievement of high speed and high capacity for signals, and multi band has been accelerated more than ever in an electronic device typified by a cellular phone. As a result, generated signal noise has had a wider band and a higher level. Therefore, for example, for the composite electronic component 1 disclosed in Japanese Unexamined Patent Application Publication No. 2011-181512, there has been a concern about whether the composite electronic component 1 is able to sufficiently remove signal noise having a wide band and a high level as described above. Accordingly, there has been a demand for an electronic component that is able to achieve a higher-attenuation and wider-band noise removal effect.

SUMMARY

Accordingly, it is an object of the present disclosure to provide a composite electronic component that is obtained by combining a common mode choke coil and an ESD protection element and is able to achieve a higher-attenuation and wider-band noise removal effect.

The present disclosure is directed to a composite electronic component obtained by combining a common mode choke coil and an ESD protection element, the composite electronic component including a component body having a laminated structure composed of a plurality of laminated insulating layers, wherein a coil portion providing the common mode choke coil and a protection element portion providing the ESD protection element are disposed so as to be aligned in a lamination direction of the component body.

According to preferred embodiments, in the coil portion, first and second coil conductors forming the common mode choke coil and magnetically coupled to each other are provided within the component body, and in the protection element portion, a ground electrode and first and second discharge electrodes forming the ESD protection element are provided within the component body, each of the first and second discharge electrodes being located so as to be spaced apart from the ground electrode at a predetermined interval.

Meanwhile, first to fourth coil terminals and a ground terminal are provided on an outer surface of the component body. Here, the first coil terminal is electrically connected to one end of the first coil conductor and the first discharge electrode, the second coil terminal is electrically connected to one end of the second coil conductor and the second discharge electrode, the third coil terminal is electrically connected to another end of the first coil conductor, the fourth coil terminal is electrically connected to another end of the second coil conductor, and the ground terminal is electrically connected to the ground electrode.

In such a composite electronic component, in order to solve the technical problem described above, a first capacitor electrode opposed to at least portions of the first and second discharge electrodes across an insulating layer in the lamination direction is further provided within the component body, and the first capacitor electrode is electrically connected to the ground electrode and the aforementioned ground terminal.

A capacitor is formed by the aforementioned first capacitor electrode and the discharge electrode, and thus the capacitors and the coil conductors form an LC filter. Therefore, it is possible to make noise removal characteristics to have higher attenuation and a wider band than in the case with merely an inductor. According to the preferred embodiments of the present disclosure, by providing the capacitor electrode such that the capacitor electrode is opposed to the discharge electrode, it is possible to cause the discharge electrode, which is hitherto included in such a type of composite electronic component, to function not only as a component of the original ESD protection element but also as a component of a capacitor. Therefore, it is possible to achieve higher attenuation and a wider band of noise removal characteristics by adding the capacitor without considerably changing the design of such a type of existing composite electronic component. Meanwhile, as the mounting board side, in many cases, it is possible to use one for an existing composite electronic component, without changing the design thereof.

Preferably, in the protection element portion, third and fourth discharge electrodes forming the ESD protection element and each located so as to be spaced apart from the ground electrode at a predetermined interval are further provided within the component body. The third coil terminal is further electrically connected to the third discharge electrode, and the fourth coil terminal is further electrically connected to the fourth discharge electrode.

According to the above preferred embodiments, even when the first and second coil terminals are connected to an input side or an output side of a signal line, it is possible to cause the ESD protection element to function at the input side.

In the above preferred embodiments, more preferably, the first capacitor electrode is opposed to not only the at least portions of the first and second discharge electrodes but also at least portions of the third and fourth discharge electrodes across the insulating layer in the lamination direction.

According to the above more preferred embodiments, it is possible to obtain an electrostatic capacity not only between the first and second coil terminals and the ground terminal but also between the third and fourth coil terminals and the ground terminal. In addition, even when the first and second coil terminals are connected to an input side or an output side of a signal line, it is possible to obtain the same circuit configuration.

In the composite electronic component according to the preferred embodiments of the present disclosure, the component body preferably has a substantially rectangular parallelepiped shape having first and second principal surfaces opposed to each other, first and second side surfaces opposed to each other, and first and second end surfaces opposed to each other, the first and second side surfaces and the first and second end surfaces connecting between the first and second principal surfaces. In this case, the first and second coil terminals are provided on the first side surface, and the third and fourth coil terminals are provided on the second side surface, and the ground terminal is provided on at least one of the first and second end surfaces.

According to the above configuration, it is possible that the same type of existing composite electronic component is replaced by the composite electronic component according to the preferred embodiments of the present disclosure without any design change at the mounting board side.

In the above configuration, the ground terminal is more preferably provided on both of the first and second end surfaces. When this more preferred configuration is adopted in addition to the configuration of including the aforementioned third and fourth discharge electrodes and the configuration of enabling an electrostatic capacity to be obtained by the third and fourth discharge electrodes, it is possible to eliminate directivity in mounting the composite electronic component.

In the preferred embodiments of the present disclosure, the composite electronic component may further include: at least one second capacitor electrode electrically connected to at least one coil terminal of the first to fourth coil terminals; and a third capacitor electrode electrically connected to the ground terminal and opposed to the second capacitor electrode across the insulating layer. In addition, the second and third capacitor electrodes are disposed within the component body and at a side of the coil portion opposite to the protection element portion side.

According to the above embodiment, first, it is possible to increase the electrostatic capacity obtained between the coil terminals and the ground terminal. In addition, since the second and third capacitor electrodes are disposed within the component body and at the side of the coil portion opposite to the protection element portion side, it is possible to dispose the electrodes or the conductors along the lamination direction of the component body in a balanced manner. Therefore, for example, when a firing step is performed for obtaining the component body, it is made possible to be less likely to cause a structural defect due to influence of contraction, occurrence of stress, or the like caused by the firing.

In the composite electronic component according to the preferred embodiments of the present disclosure, if an electrostatic capacity obtained between the ground terminal and one coil terminal of the first to fourth coil terminals is not less than about 0.2 pF and not greater than about 4.0 pF, it is possible to obtain a high noise removal effect suitable for the used frequency band of a cellular phone.

In the composite electronic component according to the preferred embodiments of the present disclosure, if an electrostatic capacity obtained between the ground terminal and one coil terminal of the first to fourth coil terminals is not less than about 0.2 pF and not greater than about 0.8 pF, it is possible to obtain a high noise removal effect suitable for the used frequency band of a cellular phone similarly to the above, and it is possible to achieve both obtaining a high capacity and ensuring reliability between electrodes having different potentials.

In the composite electronic component according to the preferred embodiments of the present disclosure, at least the insulating layer located between the capacitor electrode and the electrode opposed to the capacitor electrode so as to form a capacitor between the electrode and capacitor electrode is preferably formed from ferrite. According to such a configuration, a higher electrostatic capacity is easily obtained since ferrite has a higher dielectric constant than a general nonmagnetic material such as glass.

In the composite electronic component according to the preferred embodiments of the present disclosure, an interval between the capacitor electrode and the electrode opposed to the capacitor electrode so as to form a capacitor between the electrode and the capacitor electrode is preferably not less than about 8 µm and not greater than about 30 µm. According to this configuration, it is possible to achieve both obtaining a high capacity and ensuring reliability between electrodes having different potentials.

In the composite electronic component according to the preferred embodiments of the present disclosure, preferably, the component body has a laminated structure in which a nonmagnetic portion is interposed between magnetic portions in the lamination direction, and the coil portion is disposed in the nonmagnetic portion. According to this configuration, it is possible to form a closed magnetic circuit of the common mode choke coil by the magnetic portion.

Other features, elements, characteristics and advantages of the present disclosure will become more apparent from the following detailed description of preferred embodiments of the present disclosure with reference to the attached drawings.

DETAILED DESCRIPTION

A composite electronic component 21 according to a first embodiment of the present disclosure will be described with reference to FIGS. 1 to 6.

The composite electronic component 21 is mounted on signal lines in an electronic device such as a cellular phone and has a noise removal function as well as a function to discharge static electricity that can be generated, to ground, to prevent damage of an IC chip or the like within the electronic device.

Figure 1:
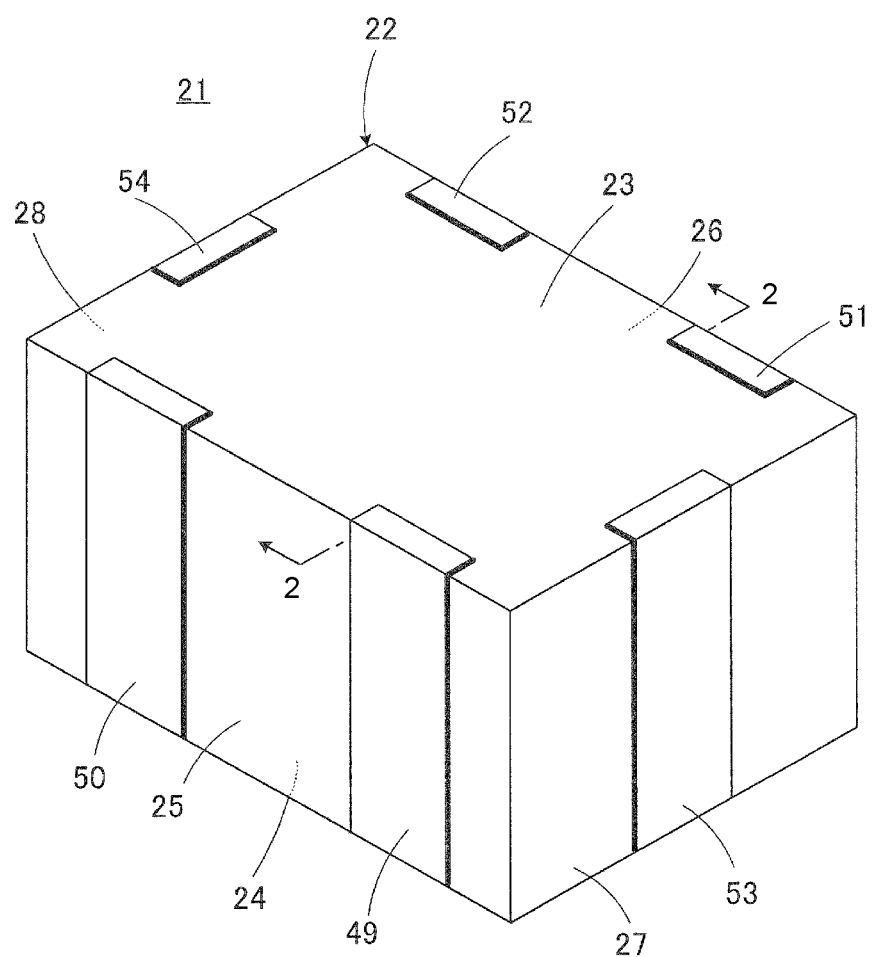
FIG. 1 is a perspective view showing the external appearance of a composite electronic component according to a first embodiment of the disclosure.

As shown in FIG. 1, the composite electronic component includes a component body 22. The component body 22 has a substantially rectangular parallelepiped shape and has first and second principal surfaces 23 and 24 opposed to each other, and first and second side surfaces 25 and 26 opposed to each other, and first and second end surfaces 27 and 28 opposed to each other, the first and second side surfaces 25 and 26 and the first and second end surfaces 27 and 28 connecting between the first and second principal surfaces 23 and 24.

Figure 3:
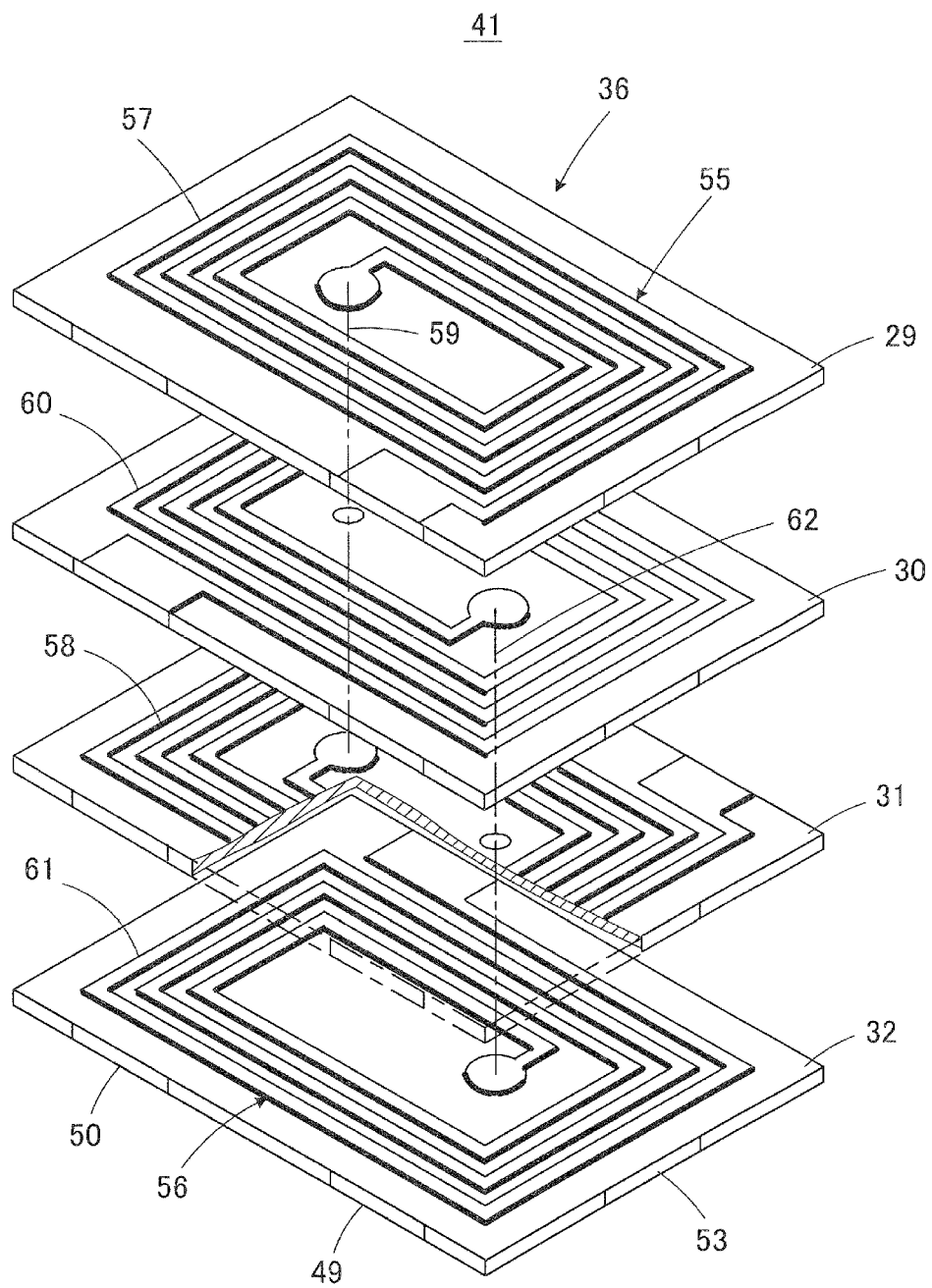
FIG. 3 is a perspective view showing a plurality of insulating layers located in a coil portion shown in FIG. 2 and having coil conductors formed thereon, in a state where the insulating layers are separated from each other.
Figure 4:
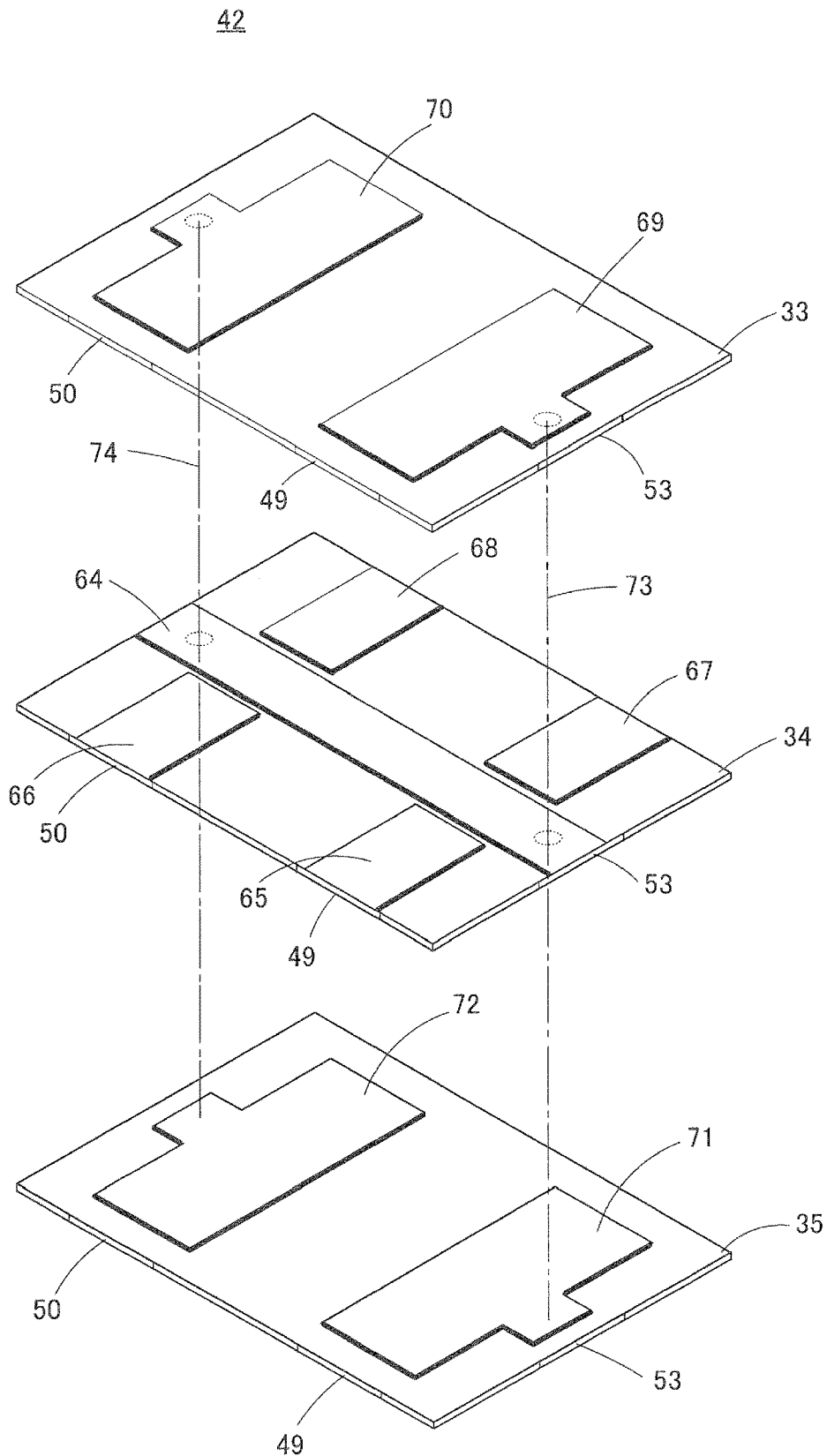
FIG. 4 is a perspective view of an insulating layer located in the protection element portion shown in FIG. 2 and having a ground electrode and discharge electrodes formed thereon and two insulating layers located in the protection element portion shown in FIG. 2 and having capacitor electrodes formed thereon, in a state where the insulating layers are separated from each other.

The component body 22 has a laminated structure composed of a plurality of laminated insulating layers including insulating layers 29 to 32 shown in FIG. 3 and insulating layers 33 to 35 shown in FIG. 4. Such a component body 22 is manufactured by using a manufacturing method that is adopted in manufacture of a general multilayer ceramic electronic component. Specifically, green sheets that are to be insulating layers are prepared, electrodes and via-hole conductors are formed therein as necessary, then a plurality of the green sheets are stacked and pressed in the stacking direction to obtain a multilayer body, and the multilayer body is cut and then fired, thereby obtaining the component body 22.

Instead of the above-described method of stacking the plurality of prepared green sheets, printing with a paste insulating material and printing with a conductive paste may be repeated to obtain a multilayer body. In addition, in the above printing, photosensitivity is imparted to the insulating material and the conductive paste, whereby it is also possible to perform fine processing by using photolithography.

Figure 2:
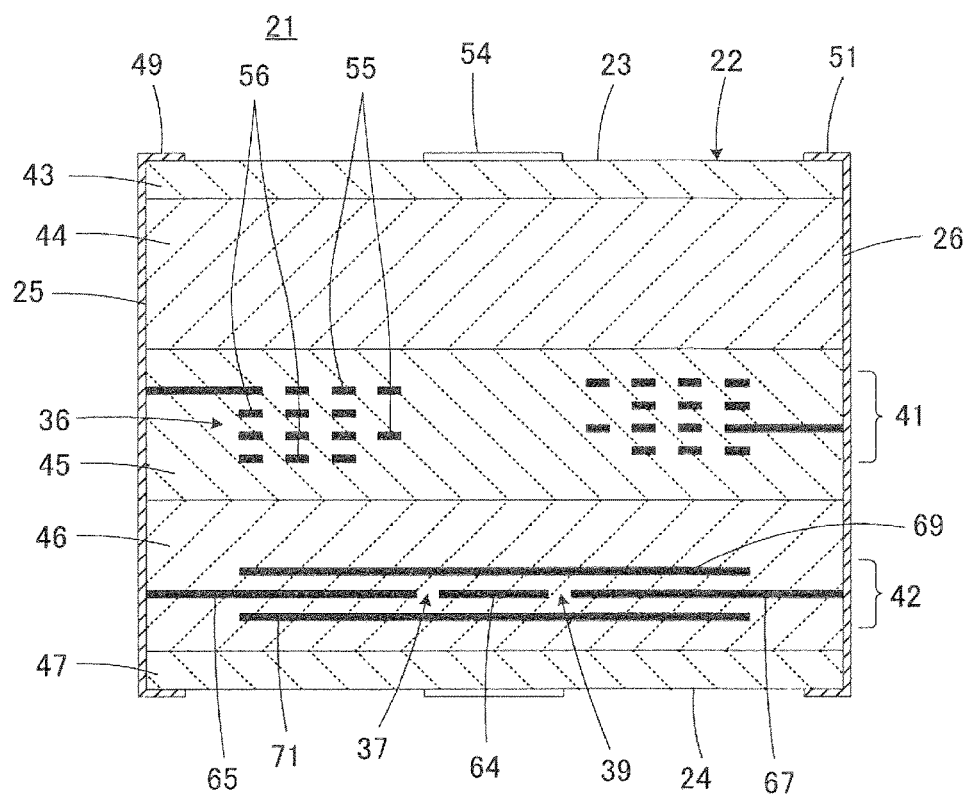
FIG. 2 is a cross-sectional view of the composite electronic component shown in FIG. 1, taken along the line 2-2 in FIG. 1.
Figure 5:
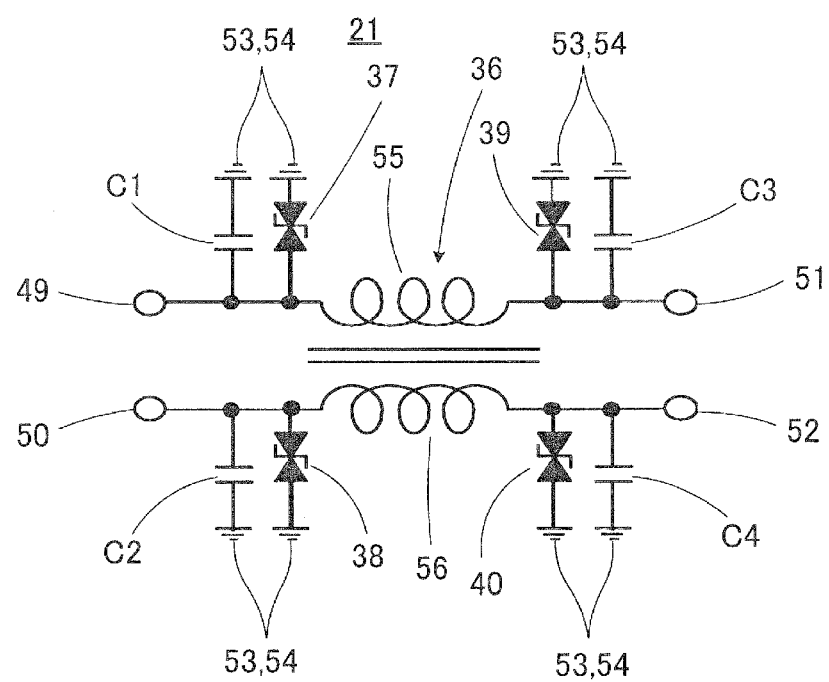
FIG. 5 is an equivalent circuit diagram of the composite electronic component shown in FIG. 1.

As shown in FIG. 5, the composite electronic component 21 is obtained by combining a common mode choke coil 36 and ESD protection elements 37 to 40. As shown in FIG. 2, in the component body 22, a coil portion 41 providing the common mode choke coil 36 and a protection element portion 42 providing the ESD protection elements 37 to 40 are disposed so as to be aligned in a lamination direction.

The component body 22 has a laminated structure in which a nonmagnetic portion 43, a magnetic portion 44, a nonmagnetic portion 45, a magnetic portion 46, and a nonmagnetic portion 47 are distributed in order from above in FIG. 2. The aforementioned coil portion 41 is disposed within the nonmagnetic portion 45 interposed between the two magnetic portions 44 and 46 in the lamination direction. With such a configuration, the common mode choke coil 36 is interposed between the two magnetic portions 44 and 46, whereby a closed magnetic circuit of the common mode choke coil 36 is formed. The nonmagnetic portions 43 and 47 located at the outermost side portion of the component body 22 may be omitted. In addition, if formation of the aforementioned closed magnetic circuit is not particularly desired, all of the insulating layers included in the component body 22 may be made of a magnetic material or a nonmagnetic material.

As clearly shown in FIG. 1, first to fourth coil terminals 49 to 52 and two ground terminals 53 and 54 are each formed on the outer surface of the component body 22 with a conductor film. The first and second coil terminals 49 and 50 are provided on the first side surface 25, the third and fourth coil terminals 51 and 52 are provided on the second side surface 26, and the ground terminals 53 and 54 are provided on the first and second end surfaces 27 and 28, respectively. In the shown embodiment, the coil terminals 49 to 52 and the ground terminals 53 and 54 are formed so as to extend to respective parts of the principal surfaces 23 and 24 of the component body 22.

Each of the coil terminals 49 to 52 and the ground terminals 53 and 54 is formed by, for example, a method in which a conductive paste containing a conductive material such as Ag, Ag—Pd, Cu, Ni, Ni—Cr, or Ni—Cu is applied and baked, or a method in which the above conductive material is formed by using sputtering or vapor deposition. Furthermore, a plating film made of a conductive material such as Ni, Sn, Cu, or Au may be formed as necessary.

As shown in FIG. 5, the common mode choke coil 36 is composed of first and second coil conductors 55 and 56 that are magnetically coupled to each other. Specific structures of these coil conductors 55 and 56 will be described with reference to FIG. 3.

The insulating layers 29 to 32 shown in FIG. 3 provide the nonmagnetic portion 45 of the component body 22 in the shown embodiment, and thus are made of a nonmagnetic material such as glass.

The first coil conductor 55 includes: a spiral pattern 57 spirally extending on the insulating layer 29; and a spiral pattern 58 spirally extending on the insulating layer 31. The outer peripheral end of the spiral pattern 57 is electrically connected to the first coil terminal 49, and the inner peripheral end of the spiral pattern 57 is electrically connected to the inner peripheral end of the spiral pattern 58 via a via-hole conductor 59 that extends through the insulating layer 29 and 30, and the outer peripheral end of the spiral pattern 58 is electrically connected to the third coil terminal (see FIGS. 1 and 2).

The second coil conductor 56 includes: a spiral pattern 60 spirally extending on the insulating layer 30; and a spiral pattern 61 spirally extending on the insulating layer 32. The outer peripheral end of the spiral pattern 60 is electrically connected to the second coil terminal 50, the inner peripheral end of the spiral pattern 60 is electrically connected to the inner peripheral end of the spiral pattern 61 via a via-hole conductor 62 that extends through the insulating layers 30 and 31, and the outer peripheral end of the spiral pattern 61 is electrically connected to the fourth coil terminal 52 (see FIG. 1).

Each of the first and second coil conductors 55 and 56 is formed by a method such as printing with a conductive paste containing a conductive material such as Ag, Ag—Pd, Cu, or Ni.

The number of turns of the spiral pattern in each coil conductor may be optionally changed according to design. In addition, the number of laminated layers of the spiral pattern in each coil conductor is two in the shown embodiment, but may be merely one or not less than three, and may be optionally changed according to design.

Next, specific structures of the ESD protection elements 37 to 40 shown in FIG. 5 will be described with reference to FIGS. 2 and 4.

The first to fourth ESD protection elements 37 to 40 are disposed in the protection element portion 42 of the component body 22 shown in FIG. 2 and include a ground electrode in common. As shown in FIG. 4, the first to fourth ESD protection elements 37 to 40 are composed of first to fourth discharge electrodes 65 to 68 located so as to be spaced apart from the ground electrode 64 at a predetermined interval, respectively. The ground electrode 64 and the discharge electrodes 65 to 68 are formed on the insulating layer 34.

Similarly to the case of the first and second coil conductors 55 and 56, each of the ground electrode 64 and the discharge electrodes 65 to 68 is formed by a method such as printing with a conductive paste containing a conductive material such as Ag, Ag—Pd, Cu, or Ni.

Although not shown in FIGS. 2 and 4, a material that promotes discharge may be provided between the ground electrode 64 and the discharge electrodes 65 to 68 as necessary, in order that discharge easily occurs between the ground electrode 64 and the discharge electrodes 65 to 68. As the material that promotes discharge, for example, a material is used which is obtained by dispersing: metal particles such as Cu particles coated with an inorganic material such as alumina; and particles made of a semiconductor material such as SiC.

The first discharge electrode 65 is electrically connected to the first coil terminal 49 together with one end of the aforementioned first coil conductor 55. The second discharge electrode 66 is electrically connected to the second coil terminal 50 together with one end of the aforementioned second coil conductor 56. The third discharge electrode 67 is electrically connected to the third coil terminal 51 together with the other end of the first coil conductor 55. The fourth discharge electrode 68 is electrically connected to the fourth coil terminal 52 together with the other end of the second coil conductor 56.

The ground electrode 64 is electrically connected to both of the ground terminals 53 and 54.

As described above, as shown in FIG. 5, the first ESD protection element 37 is inserted between the ground terminals 53 and 54 and the first coil terminal 49, the second ESD protection element 38 is inserted between the ground terminals 53 and 54 and the second coil terminal 50, the third ESD protection element 39 is inserted between the ground terminals 53 and 54 and the third coil terminal 51, and the fourth ESD protection element 40 is inserted between the ground terminals 53 and 54 and the fourth coil terminal 52.

In the embodiment, since the ground terminals 53 and 54 are provided on the first and second end surfaces 27 and 28, respectively, of the component body 22, it is possible to eliminate directivity in mounting the composite electronic component 21. However, if such an advantage is not particularly desired, either one of the ground terminals 53 and 54 may be omitted.

As a characteristic configuration of the present disclosure, as clearly shown in FIG. 4, a capacitor electrode 69 that is opposed to the first and third discharge electrodes 65 and 67 across the insulating layer 33 in the lamination direction to form a capacitor is provided in the protection element portion 42, a capacitor electrode 70 that is opposed to the second and fourth discharge electrodes 66 and 68 across the insulating layer 33 in the lamination direction to form a capacitor is provided in the protection element portion 42, a capacitor electrode 71 that is opposed to the first and third discharge electrodes 65 and 67 across the insulating layer 34 in the lamination direction to form a capacitor is provided in the protection element portion 42, and a capacitor electrode 72 that is opposed to the second and fourth discharge electrodes 66 and 68 across the insulating layer 34 in the lamination direction to form a capacitor is provided in the protection element portion 42.

Similarly to the case of the first and second coil conductors 55 and 56, each of the capacitor electrodes 69 to 72 is formed by a method such as printing with a conductive paste containing a conductive material such as Ag, Ag—Pd, Cu, or Ni.

The aforementioned capacitor electrodes 69 to 72 are electrically connected to the ground electrode 64 via via-hole conductors 73 and 74 that extend through the insulating layers 33 and 34. As a result, the capacitor electrodes 69 to 72 are electrically connected to the ground terminals 53 and 54 via the ground electrode 64. Therefore, capacitors C1 to C4 are formed between the ground terminals 53 and 54 and the first to fourth coil terminals 49 to 52 as shown in FIG. 5. Here, it should be noted that the ground terminals 53 and 54 for the ESD protection elements 37 to 40 also serve as terminals for the capacitors C1 to C4.

The aforementioned ground electrode 64, discharge electrodes 65 to 68, and capacitor electrodes 69 to 72 are disposed within the magnetic portion 46 of the component body 22. Thus, in the embodiment, the insulating layers 33 to 35 shown in FIG. 4 are made of a magnetic material.

In particular, the insulating layers 33 and 34, which are located between the capacitor electrodes 69 to 72 and the discharge electrodes 65 to 68 opposed to the capacitor electrodes 69 to 72 to form the capacitors, are preferably made of ferrite. This is because ferrite has a higher dielectric constant than a general nonmagnetic material such as glass and thus a higher electrostatic capacity is easily obtained. If such a high capacity can be obtained, it is possible to increase the flexibility in designing the patterns of the capacitor electrodes 69 to 72 and the discharge electrodes 65 to 68. Regarding the insulating layers 33 and 34, ferrite that forms the insulating layers 33 and 34 may be a magnetic material or a nonmagnetic material.

In the composite electronic component 21 described above, since the capacitors C1 to C4 are formed by the capacitor electrodes 69 to 72 and the discharge electrodes 65 to 68, an LC filter is composed of these capacitors C1 to C4 and the coil conductors 55 and 56 as is seen by referring to FIG. 5. Thus, it is possible to make noise removal characteristics to have higher attenuation and a wider band than with a mere inductor.

Figure 6:
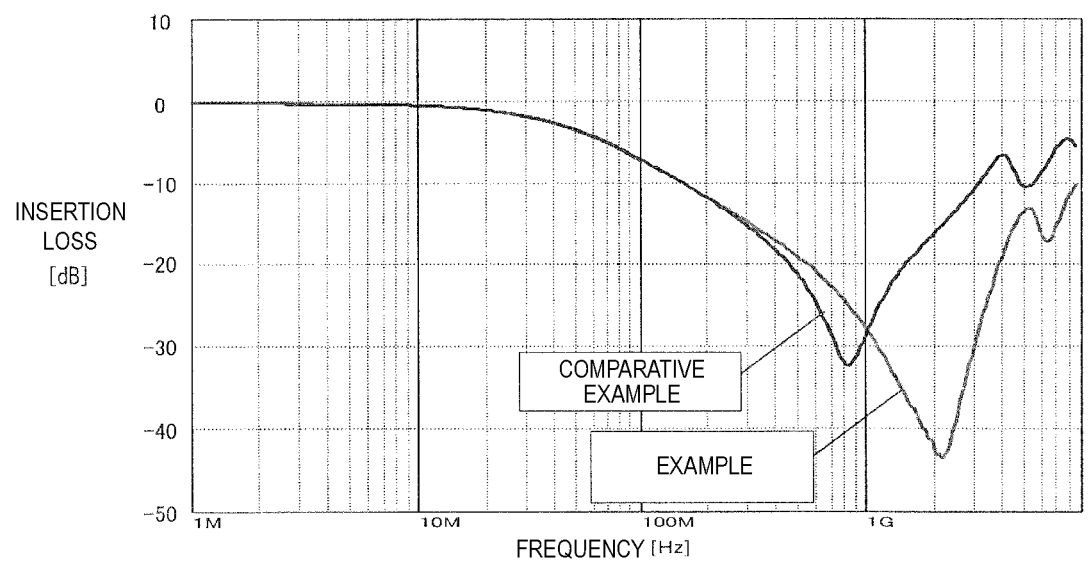
FIG. 6 is a diagram showing comparison between noise removal characteristics of a composite electronic component as an example of the present disclosure and noise removal characteristics of a composite electronic component as a comparative example not including any capacitor.

FIG. 6 shows comparison between noise removal characteristics of a composite electronic component as an example of the present disclosure and noise removal characteristics of a composite electronic component as a comparative example that does not include any capacitor. In FIG. 6, the example is a composite electronic component produced on the basis of the aforementioned first embodiment, and the example and the comparative example are different from each other only in presence/absence of capacitors, and are the same in the other conditions. As is seen from FIG. 6, according to the example, deeper attenuation characteristics are obtained around 1 GHz, which is the used frequency band of a cellular phone, as compared to the comparative example.

According to the composite electronic component 21, it is possible to achieve higher attenuation and a wider band of noise removal characteristics, by merely adding the capacitor electrodes 69 to 72 to the same type of an existing composite electronic component not including any capacitor, such that the capacitor electrodes 69 to 72 are opposed to the discharge electrodes 65 to 68, without involving a considerable structure change. Therefore, it is possible to reduce the cost for obtaining the composite electronic component 21.

The arrangement of the coil terminals 49 to 52 and the ground terminals 53 and 54 may be similar to the arrangement of coil terminals and ground terminals included in the same type of existing composite electronic component. Thus, for using the composite electronic component 21 according to the present disclosure, it is not necessary to change the mounting board side, and imposing a new load at the user side is avoided.

For connecting the aforementioned capacitor electrodes 69 to 72 and ground electrode 64, in the embodiment, the two via-hole conductors 73 and 74 are provided. However, either one of the via-hole conductors 73 and 74 may be omitted. In addition, in the embodiment, although the capacitor electrodes 69 to 72 are electrically connected to the ground terminals 53 and 54 via the ground electrode 64, the capacitor electrodes 69 and 71 may be extended to the first end surface 27 of the component body 22 to be connected directly to the ground terminal 53, and the capacitor electrodes 70 and 72 may be extended to the second end surface 28 of the component body 22 to be connected directly to the ground terminal 54.

The two capacitor electrodes 69 and 70, which are provided on the insulating layer 33 and separated from each other, may be changed to be integrated with each other. Similarly, the two capacitor electrodes 71 and 72, which are provided on the insulating layer 35 and separated from each other, may be changed to be integrated with each other.

Depending on a desired acquired electrostatic capacity, it is possible to optionally increase/decrease the opposed areas of the capacitor electrodes 69 to 72 and the discharge electrodes 65 to 68. If the acquired electrostatic capacity is allowed to be lower, either one of the electrodes 69 and 71 and/or either one of the capacitor electrodes 70 and 72 may be omitted. In addition, the electrodes that are opposed to each other to form the electrostatic capacity may not be opposed to each other over the entire surface, and may be only partially opposed to each other.

In the embodiment, although the ESD protection elements 37 to 40 are provided at both the first and second coil terminals 49 and 50 side and the third and fourth coil terminals 51 and 52 side as shown in FIG. 5, the ESD protection elements may be provided only at the first and second coil terminals 49 and 50 side or only at the third and fourth coil terminals 51 and 52 side. For example, in the case where the ESD protection elements 37 and 38 are provided only at the first and second coil terminals 49 and 50 sides, the aforementioned third and fourth discharge electrodes 67 and 68 are omitted. Therefore, in this case, the capacitors C3 and C4 shown in FIG. 5 are also not formed.

Figure 7:
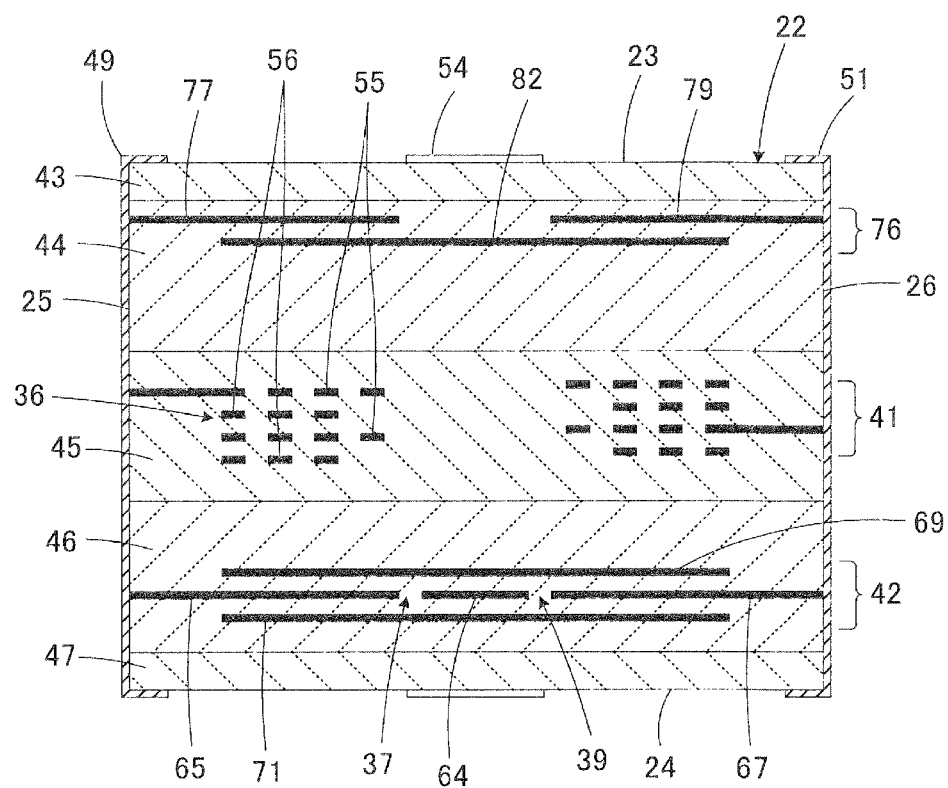
FIG. 7 is a diagram corresponding to FIG. 2 and shows a cross section, of a composite electronic component according to a second embodiment of the present disclosure, corresponding to the cross section taken along the line 2-2 in FIG. 1.

Next, a composite electronic component 21*a* according to a second embodiment of the present disclosure will be described with reference to FIGS. 7 and 8. FIG. 7 is a diagram corresponding to FIG. 2 and shows a cross section of the composite electronic component 21*a*, corresponding to the cross section taken along the line 2-2 in FIG. 1. In FIG. 7, the elements corresponding to the elements shown in FIG. 2 are designated by the same reference characters, and the overlap description is omitted.

As shown in FIG. 7, the composite electronic component 21*a* is characterized in further including a capacitor portion 76. The capacitor portion 76 is disposed in the component body 22 and at a side of the coil portion 41 opposite to the protection element portion 42 side. FIG. 8 shows an insulating layer 81 that is located in the capacitor portion 76 and has capacitor electrodes 77 to 80 formed thereon and an insulating layer 84 that is located in the capacitor portion 76 and has capacitor electrodes 82 and 83 formed thereon, in a state where the insulating layers 81 and 84 are separated from each other.

In order to distinguish the aforementioned "capacitor electrodes 69 to 72" and the above-described "capacitor electrodes 77 to 80" and "capacitor electrodes 82 and 83" from each other, the "capacitor electrodes 69 to 72" are sometimes referred to as "first capacitor electrodes", and the "capacitor electrodes 77 to 80" are sometimes referred to as "second capacitor electrodes", and the "capacitor electrodes 82 and 83" are sometimes referred to as "third capacitor electrodes".

Figure 8:
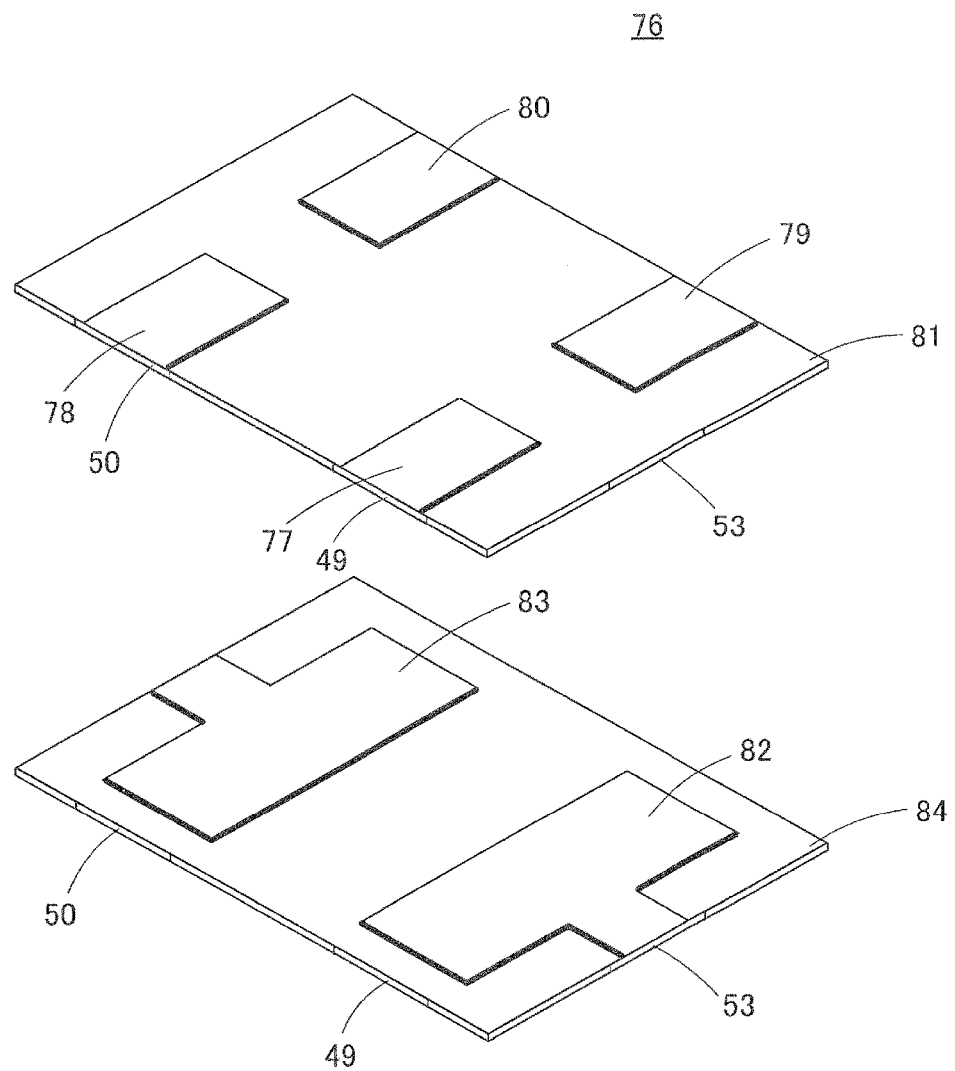
FIG. 8 is a perspective view of two insulating layers located in a capacitor portion shown in FIG. 7 and having second and third capacitor electrodes formed thereon, in a state where the insulating layers are separated from each other.

In the composite electronic component 21*a*, the four second capacitor electrodes 77 to 80 shown in FIG. 8 are formed on the insulating layer 81, and are electrically connected to the first to fourth coil terminals 49 to 52, respectively. In addition, the third capacitor electrode 82 opposed to the two second capacitor electrodes 77 and 79 via the insulating layer and the third capacitor electrode 83 opposed to the two second capacitor electrodes 78 and 80 via the insulating layer are formed on the insulating layer 84. The capacitor electrode 82 is electrically connected to the ground terminal 53, and the capacitor electrode 83 is electrically connected to the ground terminal 54.

Similarly to the case of the aforementioned first and second coil conductors 55 and 56, each of these capacitor electrodes 77 to 80, 82, and 83 is formed by a method such as printing with a conductive paste containing a conductive material such as Ag, Ag—Pd, Cu, or Ni.

Since the above-described second capacitors 77 to 80 and third capacitor electrodes 82 and 83 are formed, capacitors are formed between the ground terminal 53 and the first coil terminal 49, between the ground terminal 53 and the third coil terminal 51, between the ground terminal 54 and the second coil terminal 50, and between the ground terminal 54 and the fourth coil terminal 52. These capacitors are connected in parallel with the respective capacitors C1 to C4 shown in FIG. 5 described above, and thus contribute to an increase in electrostatic capacity as a whole.

Since the capacitor portion 76 provided by the second and third capacitor electrodes 77 to 80, 82, and 83 is disposed at the side of the coil portion 41 opposite to the protection element portion 42 side, it is possible to dispose the electrodes 64 to 72, 77 to 80, 82, and 83 along the lamination direction of the component body 22 in a balanced manner. Therefore, for example, when a firing step is performed for obtaining the component body 22, it is made possible to be less likely to cause a structural defect due to influence of contraction, occurrence of stress, or the like caused by the firing.

The above-described capacitor portion 76 is disposed within the magnetic portion 44 of the component body 22. Thus, in the embodiment, the insulating layers 81 and 84 shown in FIG. 8 are formed from a magnetic material. In this case, in particular, the insulating layer 81 located between the second capacitor electrodes 77 to 80 and the third capacitor electrodes 82 and 83 is preferably formed from ferrite. This is because ferrite has a higher dielectric constant than a general nonmagnetic material such as glass and thus a higher electrostatic capacity is easily obtained.

As is seen by referring to FIG. 8 together with FIG. 4, the second capacitor electrodes 77 to 80 have a pattern similar to that of the discharge electrodes 65 to 68, and the third capacitor electrodes 82 and 83 have a pattern similar to that of the first capacitor electrodes 69 and 70 or 71 and 72. However, the respective patterns of the second capacitor electrodes 77 to and the third capacitor electrodes 82 and 83 may be optionally changed as necessary. In addition, of the second capacitor electrodes 77 to 80, for example, the capacitor electrodes 79 and 80 may be omitted.

In the aforementioned capacitor portion 76, in the case where a higher electrostatic capacity is desired to be obtained, the number of laminated layers of each of the second capacitor electrode and the third capacitor electrode may be increased.

In any of the composite electronic components 21 and 21a described above, the opposed areas of the electrodes forming the capacitors and the distances between the electrodes are preferably adjusted such that the electrostatic capacity obtained between the ground terminals 53 and 54 and one coil terminal of the first to fourth coil terminals 49 to 52 is not less than about 0.2 pF and not greater than about 4.0 pF. In order to obtain deep attenuation in a signal frequency band of 800 MHz to 2 GHz, which is used for recent cellular phones, it is necessary to optimize the inductance and the capacity value of a common mode choke coil, and the electrostatic capacity in the above preferred range is obtained from a range where it is possible to obtain an inductance.

In any of the composite electronic components 21 and 21a, the opposed areas of the electrodes forming the capacitors and the distances between the electrodes are preferably adjusted such that, more limitedly, the electrostatic capacity obtained between the ground terminals 53 and 54 and one coil terminal of the first to fourth coil terminals 49 to 52 is not less than about 0.2 pF and not greater than about 0.8 pF.

When the electrostatic capacity is made in the more limited range as described above, it is possible to obtain a high noise removal effect suitable for the used frequency band of a cellular phone similarly to the above, and it is possible to achieve both obtaining a high capacity and ensuring reliability between electrodes having different potentials.

In any of the composite electronic components 21 and 21a, the interval between each capacitor electrode and the electrode opposed to the capacitor electrode to form a capacitor, more specifically, the interval between the discharge electrodes 65 to 68 and the first capacitor electrodes 69 to 72 and the interval between the second capacitor electrodes 77 to 80 and the third capacitor electrodes 82 and 83, are preferably not less than about 8 μm and not greater than about 30 μm. According to this configuration, it is possible to achieve both obtaining a high capacity and ensuring reliability between electrodes having different potentials.

Figure 9:
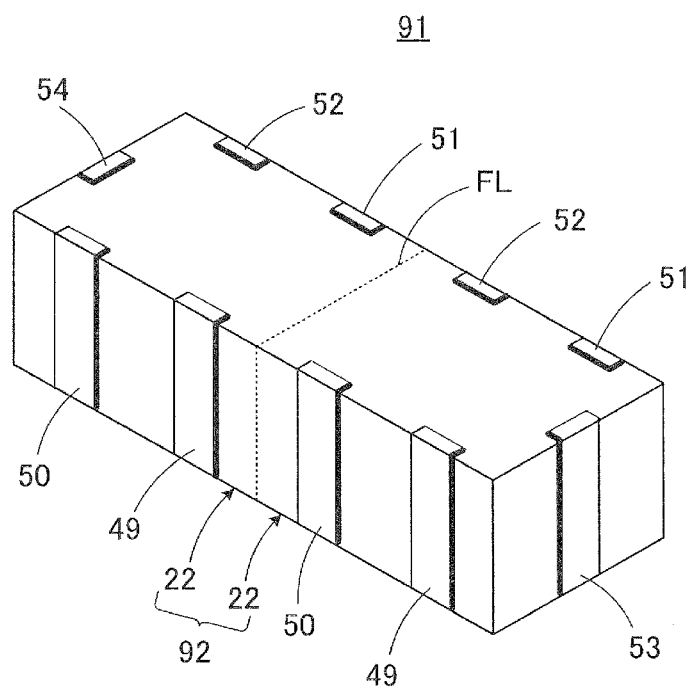
FIG. 9 is a perspective view showing the external appearance of a composite electronic component according to a third embodiment of the present disclosure.
Figure 10:
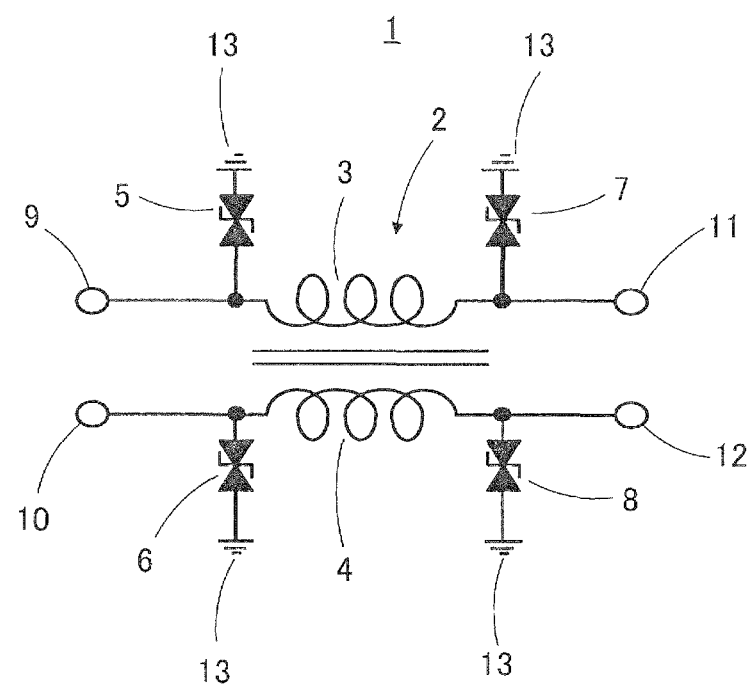
FIG. 10 is a preferred equivalent circuit diagram of a composite electronic component disclosed in Japanese Unexamined Patent Application Publication No. 2011-181512.

Next, a composite electronic component 91 according to a third embodiment of the present disclosure will be described with reference to FIG. 9. FIG. 9 corresponds to FIG. 1. In FIG. 9, the elements corresponding to the elements shown in FIG. 1 are designated by the same reference characters, and the overlap description is omitted.

The composite electronic component 91 shown in FIG. 9 is of a so-called array type. A component body 92 of the composite electronic component 91 has a long substantially rectangular parallelepiped shape. In FIG. 9, for convenience of explanation, a virtual line FL that is a dotted line is shown on the component body 92. When the component body 92 is divided into two sections along the virtual line FL, two bodies each of which is substantially the same as the component body 22 shown in FIG. 1 are obtained. That is, the component body 92 has a structure that is substantially the same as that of one obtained by connecting the two component bodies 22.

Therefore, the composite electronic component 91 includes two elements each providing the equivalent circuit shown in FIG. 5. As a composite electronic component having the configuration of the present disclosure, one including more paired elements may be provided.

It should be noted that each embodiment described in the present specification is illustrative, and the components in different embodiments can be partially replaced and combined with each other. For example, a modification described in the description of a certain embodiment is applicable to another embodiment, as its modification.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A composite electronic component obtained by combining a common mode choke coil and an electrostatic discharge protection element, the composite electronic component comprising:
    a component body having a laminated structure composed of a plurality of laminated insulating layers, wherein
    a coil portion providing the common mode choke coil and a protection element portion providing the electrostatic discharge protection element are disposed so as to be aligned in a lamination direction of the component body, in the coil portion, first and second coil conductors forming the common mode choke coil and magnetically coupled to each other are provided within the component body, in the protection element portion, a ground electrode and first and second discharge electrodes forming the electrostatic discharge protection element are provided within the component body, each of the first and second discharge electrodes being located so as to be spaced apart from the ground electrode at a predetermined interval, a first capacitor electrode is formed in the protection element portion and opposed to at least portions of the first and second discharge electrodes via the insulating layer in the lamination direction, first to fourth coil terminals and a ground terminal are provided on an outer surface of the component body, the first coil terminal is electrically connected to one end of the first coil conductor and the first discharge electrode, the second coil terminal is electrically connected to one end of the second coil conductor and the second discharge electrode, the third coil terminal is electrically connected to another end of the first coil conductor, the fourth coil terminal is electrically connected to another end of the second coil conductor, the ground terminal is electrically connected to the ground electrode and the first capacitor electrode, the component body has a laminated structure in which a nonmagnetic portion is interposed between magnetic portions in the lamination direction, and the coil portion is disposed in the nonmagnetic portion.

2. The composite electronic component according to claim 1, wherein in the protection element portion, third and fourth discharge electrodes forming the electrostatic discharge protection element and each located so as to be spaced apart from the ground electrode at a predetermined interval are further provided within the component body, the third coil terminal is further electrically connected to the third discharge electrode, and the fourth coil terminal is further electrically connected to the fourth discharge electrode.

3. The composite electronic component according to claim 2, wherein the first capacitor electrode is opposed to not only the at least portions of the first and second discharge electrodes but also at least portions of the third and fourth discharge electrodes via the insulating layer in the lamination direction.

4. The composite electronic component according to claim 1, wherein the component body has a substantially rectangular parallelepiped shape having first and second principal surfaces opposed to each other, first and second side surfaces opposed to each other, and first and second end surfaces opposed to each other, the first and second side surfaces and the first and second end surfaces connecting between the first and second principal surfaces, the first and second coil terminals are provided on the first side surface, and the third and fourth coil terminals are provided on the second side surface, and the ground terminal is provided on at least one of the first and second end surfaces.

5. The composite electronic component according to claim 4, wherein the ground terminal is provided on both of the first and second end surfaces.

6. The composite electronic component according to claim 1, wherein an electrostatic capacity obtained between the ground terminal and one coil terminal of the first to fourth coil terminals is not less than 0.2 pF and not greater than 4.0 pF.

7. The composite electronic component according to claim 1, wherein an electrostatic capacity obtained between the ground terminal and one coil terminal of the first to fourth coil terminals is not less than 0.2 pF and not greater than 0.8 pF.

8. The composite electronic component according to claim 1, wherein an interval between the capacitor electrode and the electrode opposed to the capacitor electrode so as to form an electrostatic capacity between the electrode and the capacitor electrode is not less than 8 μm and not greater than 30 μm.

9. A composite electronic component obtained by combining a common mode choke coil and an electrostatic discharge protection element, the composite electronic component comprising:

a component body having a laminated structure composed of a plurality of laminated insulating layers, wherein a coil portion providing the common mode choke coil and a protection element portion providing the electrostatic discharge protection element are disposed so as to be aligned in a lamination direction of the component body, in the coil portion, first and second coil conductors forming the common mode choke coil and magnetically coupled to each other are provided within the component body, in the protection element portion, a ground electrode and first and second discharge electrodes forming the electrostatic discharge protection element are provided within the component body, each of the first and second discharge electrodes being located so as to be spaced apart from the ground electrode at a predetermined interval, a first capacitor electrode is formed in the protection element portion and opposed to at least portions of the first and second discharge electrodes via the insulating layer in the lamination direction, first to fourth coil terminals and a ground terminal are provided on an outer surface of the component body, the first coil terminal is electrically connected to one end of the first coil conductor and the first discharge electrode, the second coil terminal is electrically connected to one end of the second coil conductor and the second discharge electrode, the third coil terminal is electrically connected to another end of the first coil conductor, the fourth coil terminal is electrically connected to another end of the second coil conductor, and the ground terminal is electrically connected to the ground electrode and the first capacitor electrode, further comprising:

at least one second capacitor electrode electrically connected to at least one coil terminal of the first to fourth coil terminals; and a third capacitor electrode electrically connected to the ground terminal and opposed to the second capacitor electrode via the insulating layer, wherein the second and third capacitor electrodes are disposed within the component body and at a side of the coil portion opposite to the protection element portion side.

10. A composite electronic component obtained by combining a common mode choke coil and an electrostatic discharge protection element, the composite electronic component comprising:

a component body having a laminated structure composed of a plurality of laminated insulating layers, wherein a coil portion providing the common mode choke coil and a protection element portion providing the electrostatic discharge protection element are disposed so as to be aligned in a lamination direction of the component body, in the coil portion, first and second coil conductors forming the common mode choke coil and magnetically coupled to each other are provided within the component body, in the protection element portion, a ground electrode and first and second discharge electrodes forming the electrostatic discharge protection element are provided within the component body, each of the first and second discharge electrodes being located so as to be spaced apart from the ground electrode at a predetermined interval, a first capacitor electrode is formed in the protection element portion and opposed to at least portions of the first and second discharge electrodes via the insulating layer in the lamination direction, first to fourth coil terminals and a ground terminal are provided on an outer surface of the component body, the first coil terminal is electrically connected to one end of the first coil conductor and the first discharge electrode, the second coil terminal is electrically connected to one end of the second coil conductor and the second discharge electrode, the third coil terminal is electrically connected to another end of the first coil conductor, the fourth coil terminal is electrically connected to another end of the second coil conductor, the ground terminal is electrically connected to the ground electrode and the first capacitor electrode, and at least the insulating layer located between the capacitor electrode and the electrode opposed to the capacitor electrode so as to form an electrostatic capacity between the electrode and capacitor electrode is formed from ferrite.

* * * * *